United States Patent [19]

Suzuki et al.

[11] Patent Number: 4,871,257
[45] Date of Patent: Oct. 3, 1989

[54] OPTICAL APPARATUS FOR OBSERVING PATTERNED ARTICLE

[75] Inventors: Akiyoshi Suzuki, Tokyo; Michio Kohno, Kawasaki, both of Japan

[73] Assignee: Canon Kabushiki Kaisha, Tokyo, Japan

[21] Appl. No.: 225,826

[22] Filed: Jul. 29, 1988

Related U.S. Application Data

[63] Continuation-in-part of Ser. No. 169,131, Mar. 10, 1988, abandoned, and Ser. No. 122,581, Nov. 16, 1987, abandoned, which is a continuation of Ser. No. 910,817, Sep. 23, 1986, abandoned, which is a continuation of Ser. No. 555,523, Nov. 23, 1983, abandoned, said Ser. No. 169,131, is a continuation of Ser. No. 102,808, Sep. 22, 1987, abandoned, which is a continuation of Ser. No. 773,771, May 14, 1985, abandoned.

[30] Foreign Application Priority Data

| Dec. 1, 1982 | [JP] | Japan | 57-210908 |
| May 17, 1984 | [JP] | Japan | 59-100297 |
| May 30, 1984 | [JP] | Japan | 59-110064 |
| May 31, 1984 | [JP] | Japan | 59-111548 |

[51] Int. Cl.$^4$ ............... G01B 11/00; G01N 21/88; G01N 21/47
[52] U.S. Cl. .............. 356/400; 350/523; 356/237; 356/401; 356/446
[58] Field of Search ............ 356/237, 363, 390, 399, 356/400, 401, 129, 446; 350/523, 525, 526; 250/557, 548; 355/53

[56] References Cited

U.S. PATENT DOCUMENTS

| 3,850,527 | 11/1974 | Winthrop et al. | 356/129 |
| 3,879,131 | 4/1975 | Cuthbert et al. | 250/550 |
| 3,930,713 | 1/1976 | Stankewitz | 350/525 |
| 4,062,623 | 12/1977 | Suzuki et al. | 356/401 |
| 4,202,627 | 5/1980 | Suzki et al. | 250/548 |
| 4,251,129 | 2/1981 | Suzki et al. | |
| 4,390,279 | 6/1983 | Suwa | 356/401 |
| 4,423,959 | 1/1984 | Nakazawa et al. | 356/363 |
| 4,595,289 | 6/1986 | Feldman et al. | 356/237 |
| 4,601,577 | 7/1986 | Gotou et al. | 356/237 |

OTHER PUBLICATIONS

Khoury, IBM Technical Disclosure Bulletin, vol. 17, No. 10, Mar. 1975, p. 2895.

Primary Examiner—F. L. Evans
Attorney, Agent, or Firm—Fitzpatrick, Cella, Harper & Scinto

[57] ABSTRACT

In a detection optical apparatus for an object having an actual circuit pattern that diffracts an incident light and has an alignment pattern, an illumination device having a first aperture for controlling the beam of light, the illumination device adapted to effect a dark-field illumination to the object, and an imaging optical system for forming the image of the object. The imaging optical system has a second aperture located at a position optically conjugate with the first aperture by way of the object, the first and second apertures being not overlapped when the image of the first aperture is formed on the second aperture. The second aperture has such a light blocking area that blocks diffraction light produced when the beam of light passed through the light-transmitting area of the first aperture is incident on the actual circuit pattern. Also, an optical inspection apparatus for optically inspecting articles such as photomasks or wafers, having patterns each formed by linear pattern elements having a certain directional characteristic with respect to plural directions, is disclosed. Among the linear pattern elements, at least those extending in one direction are extracted out and observed in a dark field, and any faults of the pattern such as breaks or the like and any foreign particles adhered to the pattern are detected on the basis of a reduced amount of information as compared with the information concerning the whole pattern.

5 Claims, 12 Drawing Sheets

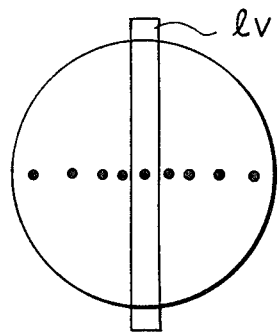
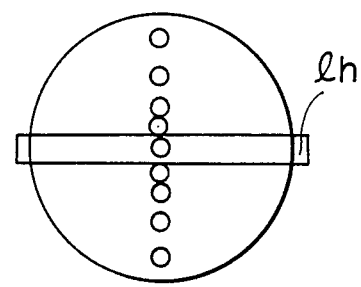
FIG. 3    FIG. 4
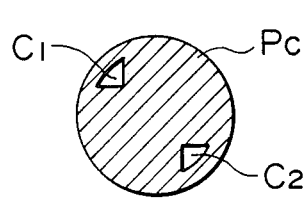
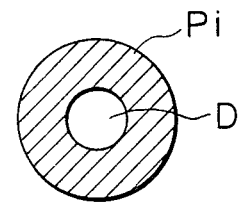
FIG. 5    FIG. 6

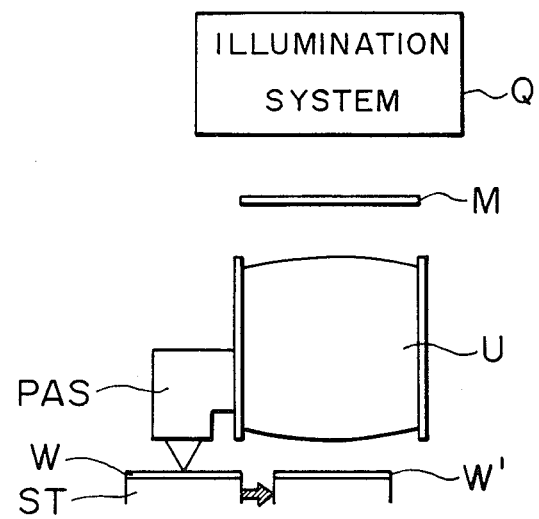
F I G. 10
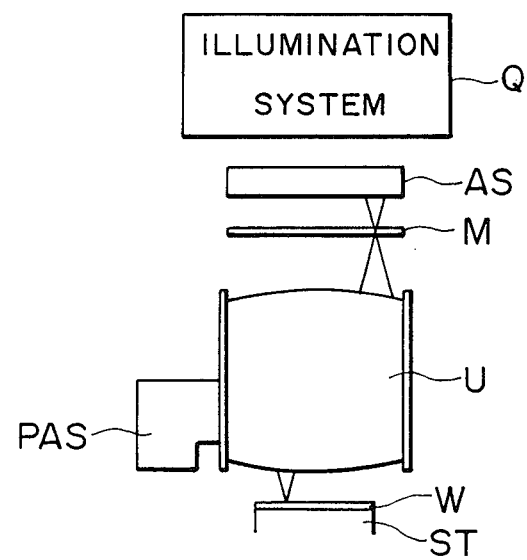
F I G. 11

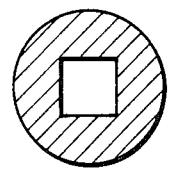
F I G. 12
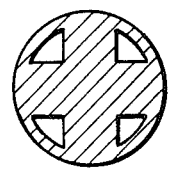
F I G. 13
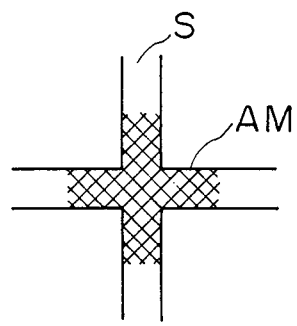
F I G. 14

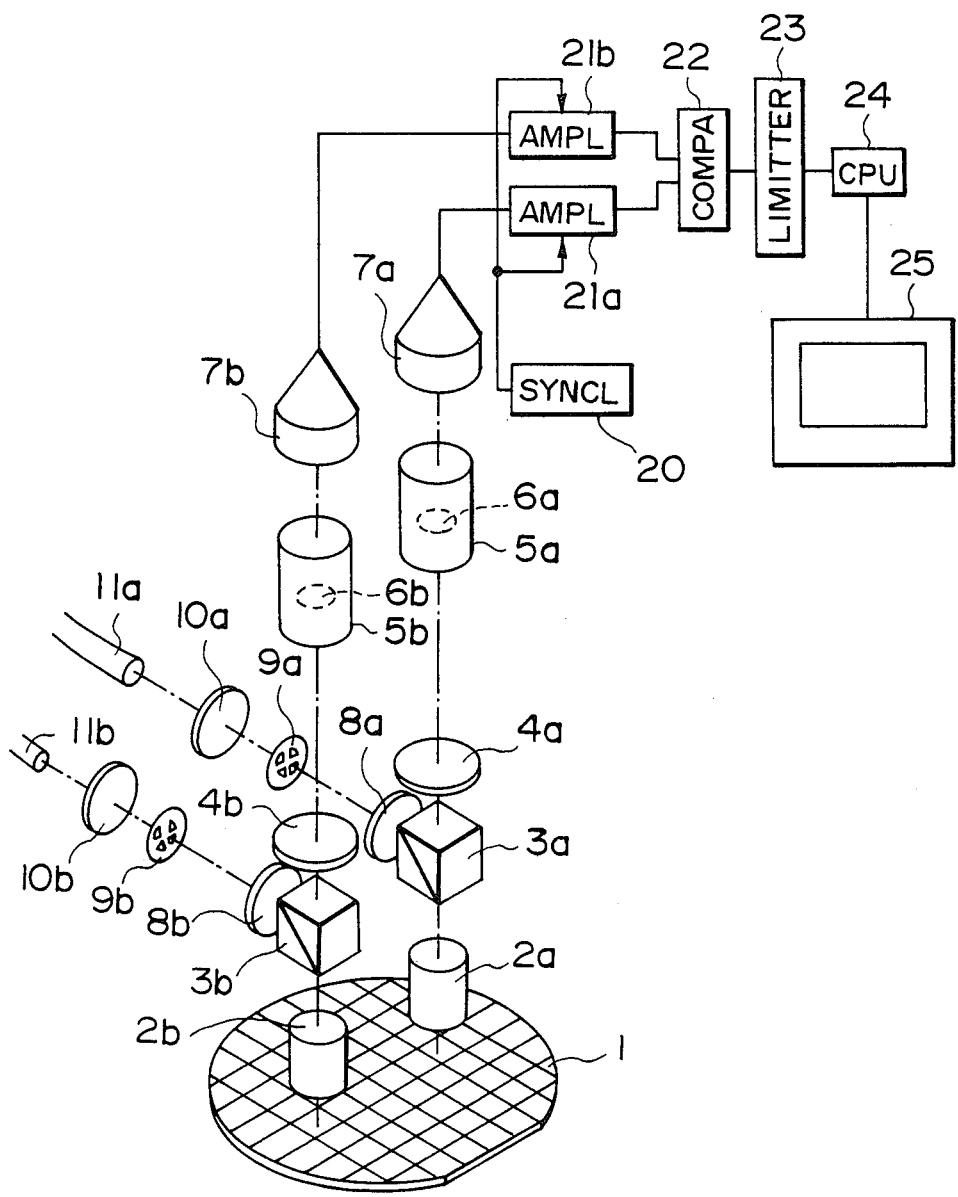
F I G. 15

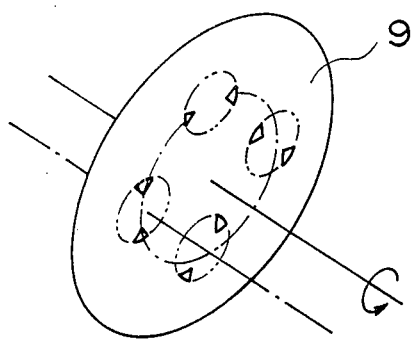
FIG. 18
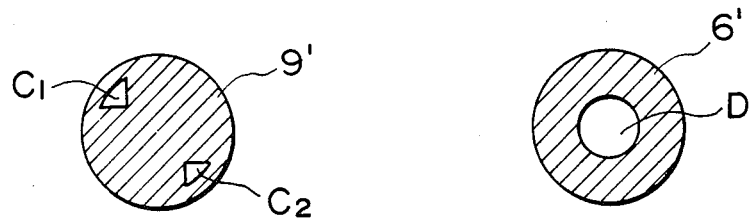
FIG. 19    FIG. 20
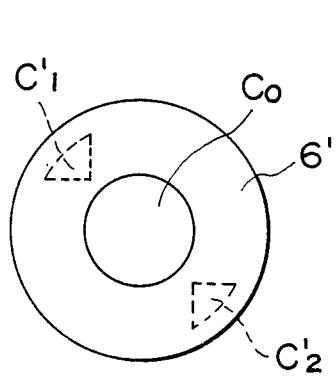    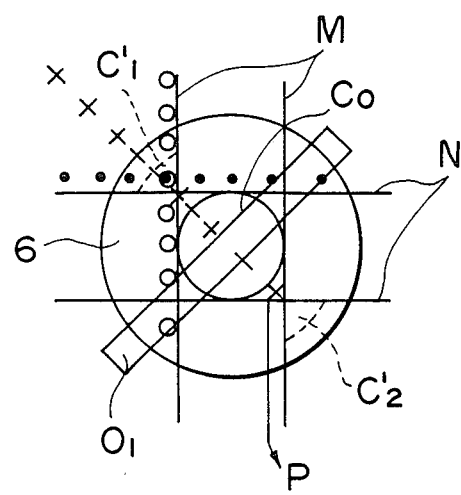
FIG. 21    FIG. 22

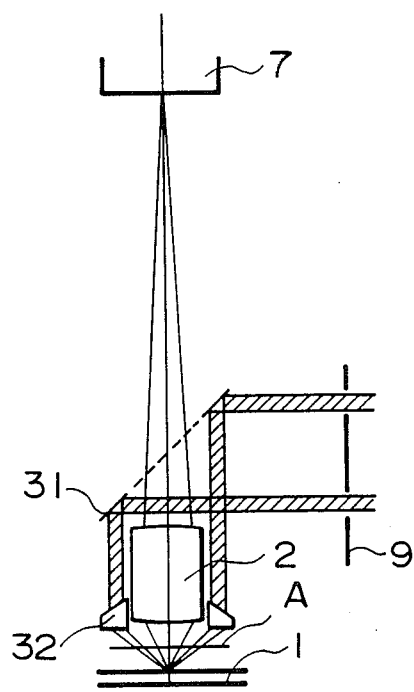
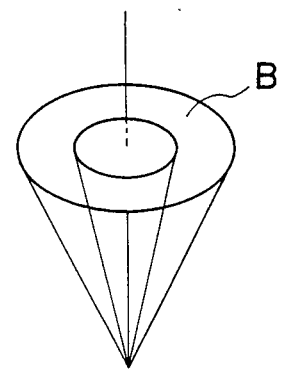
F I G. 23A          F I G. 24
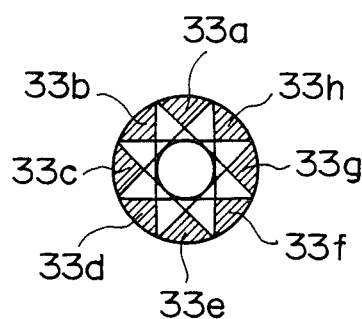
F I G. 23B

OPTICAL APPARATUS FOR OBSERVING PATTERNED ARTICLE

This application is a continuation-in-part of application Ser. No. 122,581, filed Nov. 16, 1987, now abandoned which was a continuation of application Ser. No. 910,817, filed Sept. 23, 1986, now abandoned which was a continuation of application Ser. No. 555,523, filed Nov. 23, 1983, now abandoned. This application is also a continuation-in-part of application Ser. No. 169,131, filed Mar. 10, 1988, now abandoned which was a continuation of application Ser. No. 102,808, filed Sept. 22, 1987, now abandoned, which was a continuation of application Ser. No. 733,771, filed May 14, 1985, now abandoned.

FIELD OF THE INVENTION AND RELATED ART

This invention relates to a detection optical apparatus for visually observing a particular pattern on an object through the naked eye of an operator or a TV receiver and/or for photoelectrically detecting the same pattern. Particularly, the present invention relates to an apparatus for detecting alignment mark means on objects in a semiconductor integrated circuit manufacturing system, which apparatus can distinguish an alignment mark pattern from an actual element pattern (circuit pattern) upon detection.

In another aspect, the invention relates to an optical inspection apparatus for inspecting articles More particularly, the invention in this aspect is concerned with an optical inspection apparatus for photoelectrically inspecting articles such as photomasks or semiconductor wafers having patterns, e.g., integrated-circuit patterns, each having a certain directional characteristic with respect to plural directions, or for observing such articles through a television receiver or an eyepiece lens, to thereby detect any fault of the pattern.

Recently, the integration of semiconductor integrated circuits has been accelerated. Therefore, the width of line in these circuits is increasingly being decreased. To print finer electronic-circuit (actual element) patterns on wafers, there is utilized an optical projection and exposure system for projecting the circuit pattern of a mask on a wafer through an imaging lens or reflection system with high resolution or a system for printing the pattern of the mask when the mask and wafer are in contact with or in the proximity to each other.

Upon the exposure of the wafer, it is essential to align a mask and wafer with each other prior to exposure with high accuracy of one $\mu$m or less. To deal with a great number of wafers per hour, an automatic alignment operation is required which must be compatible with such high accuracy In the prior art systems, a mask and a wafer respectively having alignment marks formed thereon were aligned with each other by causing them to overlap one on the other or to position with a predetermined positional relationship while observing the marks of the mask and the wafer through a microscope system. An automatic alignment operation is made by photoelectrically detecting such alignment marks. For verification, these marks can visually be observed by an operator In a particular case, the mask and wafer can manually be aligned with each other through the operator's visual observation. One of such automatic alignment systems is disclosed, for example, in U.S. Pat. No. 4,251,129 which was assigned to the assignee of the present application. In this patent, the reflective light from alignment marks is subjected to a spatial frequency filtering at the pupil position within a microscope so that the diffraction light by the alignment marks being detected.

As shown in FIG. 1 an alignment mark AM may be provided on a wafer at the cost of the area for one of the chips thereon or on a scribe line S (FIG. 1). However, since the actual element pattern provides the same optical phenomenon as that of the alignment-mark defining element, the reflectively diffracted light from the alignment mark will be mixed with that from the circuit pattern of the actual element, resulting in difficult alignment if the alignment mark is present near the circuit pattern of the actual element.

A method for avoiding such a problem is that the alignment mark is located sufficiently away from the actual element. However, this method provides another problem in that the effective area in the actual element is reduced.

In addition to the above alignment operation with respect to the mask and wafer, a pre-alignment operation is known in which the coordinate position of the wafer outside the exposure stage is detected with a relatively rough accuracy and thereafter the wafer is moved to the exposure stage, and then it is accurately aligned with the mask. In this case, when the position of the wafer is to be photoelectrically detected, the detection is adversely affected by the actual element circuit pattern similarly.

Further, in the semiconductor devices such as integrated circuits (ICs) or large scaled integrated circuits (LSIs), the circuit pattern is usually formed by a combination of vertically extending rectilinear elements with horizontally extending rectilinear elements. This is for the sake of convenience in circuit designing or pattern drawing. In a case of memory cells, connections or automatic alignment marks, inclined rectilinear elements are used, but usually angles of ±45 degrees are selected for these inclined linear pattern elements.

There has been proposed an inspection apparatus for inspecting photomasks or semiconductor wafers to detect any foreign particles adhered to the circuit pattern of the photomask or the wafer. In this known type inspection apparatus, the circuit pattern is irradiated with a laser beam and, in the path of the light transmitted through or reflected from the circuit pattern, a spatial filter having preparatively formed therein a pattern exactly corresponding to the circuit pattern of the photomask or the wafer is disposed to cancel or extinguish the information light concerning the correct circuit pattern so that only images of the foreign particles adhered to the photomask or the wafer are formed on a predetermined plane. This inspection apparatus however involves a disadvantageous problem. That is, it requires an own spatial filter for each of different photomasks or wafers having different circuit patterns.

SUMMARY OF THE INVENTION

It is a principal object of the present invention to provide a detection optical apparatus which can definitely detect a pattern to be detected in distinction from the other pattern even if they are disposed in proximity to each other.

In a preferred embodiment of the present invention, a wafer having an alignment mark constituted of a group of inclined lines near an actual element pattern mainly including vertical and horizontal lines is dark-field illuminated. To do this, the apparatus comprises a wafer illumination system having its aperture located within the illumination optical path and an imaging system containing another aperture disposed at a position optically conjugate with the aperture through the flat surface of the wafer as a mirror plane. The configuration of the aperture Pc in the illumination system is so determined that the diffraction and reflection light of the alignment mark is selected, in association with the aperture Pi in the imaging system, with the remaining light being blocked.

It is another object of the present invention to provide an improved optical inspection apparatus for inspecting articles such as photomasks or wafers, which apparatus is free from at least one of the problems described hereinbefore.

Briefly, according to one aspect of the present invention, there is provided an optical inspection apparatus for optically inspecting articles such as photomasks or wafers, having patterns each formed by linear pattern elements with a certain directional characteristic with respect to plural directions. Among the linear pattern elements, at least those extending in one direction are extracted out and observed in a dark field, and any faults of the pattern such as breaks or the like and any foreign particles adhered to the pattern are detected on the basis of a reduced amount of information as compared with the information concerning the whole pattern.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3 and 4 are views respectively showing relationships between linear patterns and diffraction lights;

FIGS. 5, 6 and 7 are plan views respectively showing elements used in the embodiment of the present invention;

FIG. 8 illustrates the optical function;

FIG. 10 illustrates a pre-alignment;

FIG. 11 illustrates an operation by which a mask and wafer are being aligned with each other;

FIGS. 12 and 13 are plan views respectively showing components in other embodiments of the present invention;

FIG. 14 is a view showing another alignment mark used in the present invention;

FIG. 15 is a schematic and diagrammatic view showing an optical inspection apparatus according to an embodiment of the present invention;

FIG. 18 is a perspective view showing an example of the aperture means at the illumination system side;

FIGS. 19 and 20 are plan views, respectively, showing elements used in the dark field detection;

FIGS. 21 and 22 are principle views, respectively, for illustrating the dark field detection, according to the present invention, relative to a particular pattern element extending in a particular direction;

FIG. 23A is a sectional view schematically showing an optical inspection apparatus according to another embodiment of the present invention, wherein dark field illumination is effected with illumination light passing outside an objective lens;

FIG. 23B shows an angular distribution of the light directed to and reflected from one point on an object;

FIG. 24 is a perspective view schematically showing the angular distribution of FIG. 23B;

DESCRIPTION OF THE PREFERRED EMBODIMENTS

Figure 2:
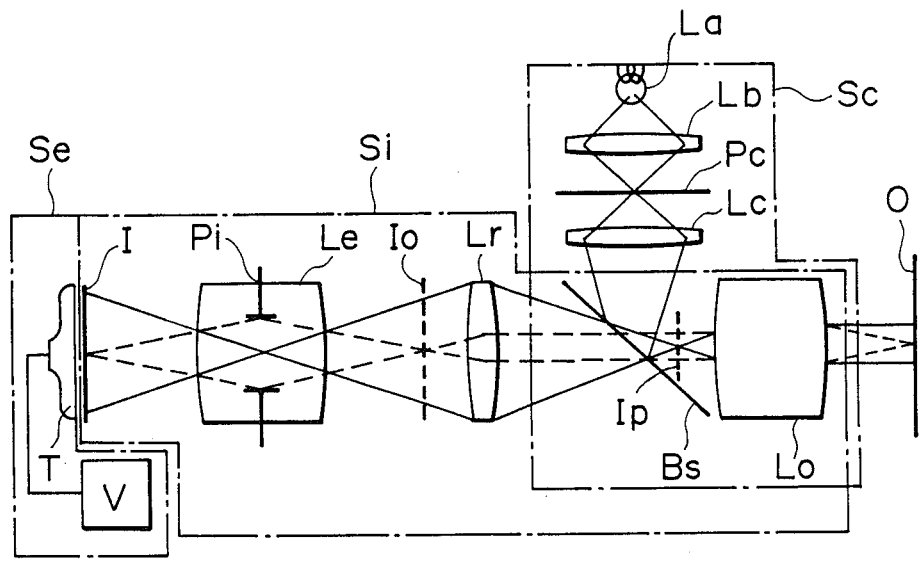
FIG. 2 is an optical section of one embodiment of the present invention.

Referring now to FIG. 2, the surface of a wafer or mask is shown as an objective plane O. The illustrated apparatus comprises an illumination system Sc which includes a source of illuminating light La, a first condenser lens Lb, an illumination aperture plate Pc which will be hereinafter described in detail, a second condenser lens Lc, a beam splitter Bs and a microscope objective lens Lo. A light beam from the source La illuminates the aperture of the aperture plate Pc through the first condenser lens Lb. The light emitted from this aperture at a point is subjected to an imaging action in the second condenser lens Lc and then reflected by the beam splitter Bs toward the objective lens Lo in which the light is once imaged at the pupil position thereof and then illuminates the objective plane O through the objective lens Lo. Such an imaging relationship is depicted by solid lines in FIG. 2.

The illustrated apparatus also comprises an imaging system Si which includes the microscope objective lens Lo, the beam splitter Bs, a relay lens Lr and an erector lens Le which enlarges the image. The light emitted from the objective plane O at a point is condensed by the objective lens Lo and then once imaged on the intermediate imaging position Io by the relay lens Lr. The light is further imaged on the final position I through the erector lens Le with an increased magnification. This final plane is a surface to be photoelectrically detected, a surface to be visually observed through an eyepiece or a TV image pick-up surface. The imaging relationship in this system is depicted by broken lines in FIG. 2.

The solid-line light beam in the imaging system Si is one which is specularly reflected by the objective plane O when it is illuminated by collimated rays in the manner that the principal rays emitted from the objective lens are perpendicularly incident on the objective plane. After passing back through the objective lens Lo, this light beam is imaged on the pupil Ip and further on the second imaging plane (at position Pi) through the relay lens Lr. Although the illustrated embodiment includes the second imaging plane within the erector lens Le, the second imaging plane may be located outside. The aperture plane Pi is disposed in the second imaging plane to block unnecessary light. The illustrated apparatus further comprises a well-known photoelectric detecting system Se, a photoelectric converter T such as a TV camera, photosensor or the like, and an electric processing circuit V, of which known systems are usable and which are not parts of the present invention, and therefore detailed explanation is omitted for the sake of simplicity.

There will now be described the relation between the orientation of lines defining an alignment mark on the object and the distribution of diffraction lights produced by the above lines at the microscope pupil or a position conjugate with that pupil.

First of all, a linear pattern is placed on the objective plane O in a given direction. This linear pattern is then illuminated through a pin-hole formed in the illumination aperture plate Pc at its center. As a result, diffraction lights appear on the plane including the aperture plate Pi in the imaging system, in an array extending in the direction perpendicular to the linear pattern. For example, if a linear pattern $l_v$ is disposed in the vertical direction (perpendicular to the front panel of a semiconductor exposure apparatus) as shown in FIG. 3, the resulting diffraction lights appear in the form of a transverse row extending from the 0-order light (direct light) in the opposite directions. If a linear line $l_h$ is disposed in the horizontal direction as shown in FIG. 4, the resulting diffraction lights appear in the form of vertical row. If the pin-hole in the aperture plate Pc is shifted, the 0-order and subsequent lights are accordingly shifted on the plane including the aperture plate Pi in the imaging system. Consequently, if the pin-hole is increased in size, diffraction lights is considered to be an integration of the pin-holes. In other words, the distribution of diffraction lights on the plane including the imaging system aperture plate Pi will be determined in accordance with the orientation of the pattern formed on the object and the configuration of the aperture in the illumination system aperture plate Pc. The opening portion of the aperture plate is displaceable, as the case may be, by a mirror surface having the same configuration.

A dark-field illumination system which is constructed in accordance with the above principle and which can selectively detect only a pattern in a particular direction with higher accuracy, will be described.

FIG. 5 shows a preferred configuration of apertures C1 and C2 formed at the aperture Pc position in the illumination system.

Figures 7, 8:
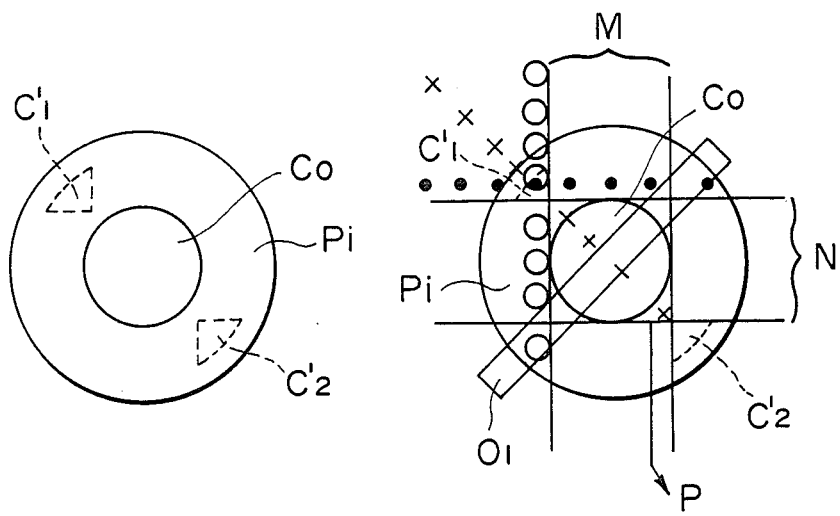

The state of the imaging plane when the apertures C1 and C2 in the aperture plate Pc are projected on the aperture plate Pi in the imaging system is shown in FIG. 7. As shown in FIG. 7, the aperture plate Pi has a central opening Co. Symbols C1' and C2' designates the images of the apertures C1 and C2, respectively. FIG. 8 shows the same arrangement as that of FIG. 7, except two sets of parallel lines M and N added. These parallel lines are oriented to be coincide with the respective vertical and horizontal lines used to form an actual circuit pattern such that the parallel lines will circumscribe an opening Co and intersect the other set of parallel lines at a right angle. Now, suppose that the apertures C1 and C2 in the illumination system are so disposed on the plane Pc that the images C1' and C2' thereof will be formed in a plane Pi outside of the region defined by two sets of parallel lines M and N and symmetrically with respect to the optical axis. In accordance with the aforementioned principle, diffraction lights due to the vertical and horizontal lines in the actual element on a wafer distribute along both of the orthogonal lines from the 0-order light which is any point within the aperture C1' and C2', as shown in FIG. 8. As a result, the diffraction light from apertures C1' and C2' will not pass through the aperture Co so that the diffraction lights of the patterns in these directions cannot be observed on the image surface I.

If a pattern formed by a group of lines extending an oblique direction of particularly 45 degrees is provided on the objective plane O as an alignment mark, the resulting diffraction lights distribute along a line inclined by 45 degrees to pass through the aperture Co in the aperture plate Pi, as shown by x in FIG. 8. As a result, the alignment mark can photoelectrically be detected and also visually observed at the final imaging plane I (FIG. 2).

By providing such an appropriate combination of the optical path of illumination beam with the apertures of the light receiving system, any unnecessary diffraction light due to the orthogonal lines in the actual circuit pattern can be blocked to detect only the desired light beam so that the alignment will be increased in accuracy.

When it is required to effect a bright-field illumination for observation, an aperture plate having a circular aperture D as shown in FIG. 6 may be used in place of the aperture plate Pc in the illumination system to illuminate the objective plane O. The image of the objective plane O is imaged on the final imaging plane I through the objective lens Lo, relay lens Lr and erector lens Le. Thus, the dark field can be changed to the bright field simply by changing the shape of aperture at the Pc plane.

The optical system having the aforementioned features is preferably used as an optical system for aligning a mask or reticle and a wafer with each other in a semiconductor circuit producing system, as described hereinbefore. If an alignment mark extending in the different direction from those of the orthogonal lines in the actual circuit patterns, for example, in the direction of 45 degrees relative to both the orthogonal lines is used, the optical system according to the present invention will be applied directly to the semiconductor circuits producing system. The present invention can be applied to either of the simultaneous observation of both the mask (or reticle) and wafer to be aligned with each other or the separate observation of one of the mask and wafer.

The simultaneous observation system is material in a so-called contact or proximity systems. If the above simultaneous observation is incorporated into the projection imaging system, the so-called TTL system will be used. If the projection optical system is of mirror type, a white light may be used. If, however, the projection optical system is of lens type, it will be constrained with respect to the range of wavelength based on the chromatic aberration of that lens system. More particularly, it is essential to provide an interference filter or sharp cut filter.

Figure 9:
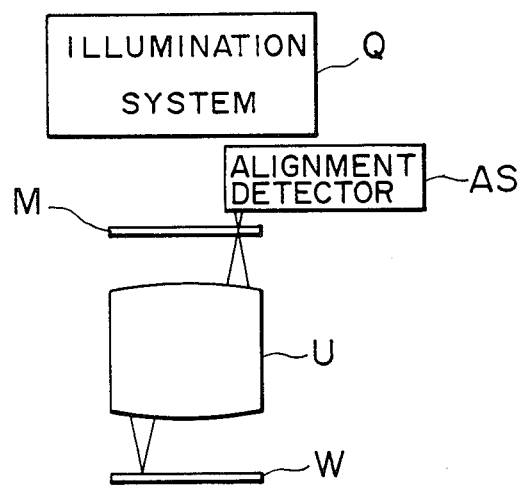
FIG. 9 is a schematic view of a semiconductor exposure apparatus.

FIG. 9 shows an arrangement of the simultaneous observation which includes an alignment detector unit AS, a projection lens U, an illumination system Q, a mask M and a wafer W. In this arrangement, an image detected by the alignment detector unit AS is converted into signals which can be used to energize a drive system (not shown) for alignment.

The optical system of the present invention can preferably be used also as an optical system for separately observing and detecting the mask or reticle and the wafer. Most typical one of such optical systems is a so-called off-axis alignment method which is utilized in the step-and-repeat type exposure apparatus called "stepper". In the off-axis alignment method, a reference position is set at a location spaced apart, from the exposure position faced to the projection optical system, by a predetermined distance The reference position is observed by a microscope. After the wafer is once aligned accurately on the reference position, the wafer is moved to the exposure position faced to the projection optical system, relying on the accuracy of the stage movement. The optical system of the present invention can preferably be used as a microscope for providing the above reference position. In this case, the optical system will not be of dual function also as the projection optical system. It is thus possible to use an objective lens having a higher resolving power and a white light.

FIG. 10 shows an arrangement of the off-axis alignment method in which a pre-alignment is shown in a projection type semiconductor exposure system.

FIG. 11 shows the arrangement of FIG. 10 when it is used to align the wafer W and the mask M with each other.

In FIGS. 10 and 11, the arrangement includes a reduction-projection lens U, a system Q for illuminating the mask, a prealignment sensor PAS, a movable stage ST on which the wafer is placed, and a mask-wafer alignment sensor AS.

Figure 1:
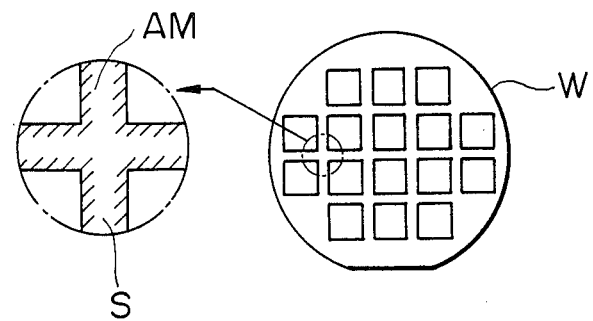
FIG. 1 is a plan view exemplifying an alignment mark on a wafer.

In general, the system for aligning the mask (or reticle) and wafer with each other requires the high accuracy in the order of submicrons. On the other hand, such a system cannot avoid a reduced range of detection (field of view) if it the accuracy is increased. If an alignment is carried out through the projection lens or in accordance with the TTL method as shown in FIG. 11, there is required such a function that the wafer F (FIG. 10) is preliminarily detected with respect to its position and thereafter moved to a predetermined position which is within the field of view for alignment. In other words, the movable stage ST is moved by a predetermined distance through a servo mechanism in consideration of the detected position of the wafer. This function is called the pre-alignment of the wafer. Wafers are usually subjected to the exposure operation in the other stations of the exposure system. Thus, the shape of wafer cannot often be conformed to a specific station. The mechanical prealignment, therefore, is hard to ensure its accuracy. For the above purpose, the microscope system for prealignment of the wafer must have a broader range of detection. As a result, the microscope for prealignment of the wafer will have its field of view which can covers more orthogonal lines of the actual circuit patterns than the microscope for main alignment between the mask and wafer with each other.

Where it is wanted to effect the prealignment under the above situation and if an alignment mark for pre-alignment is located on a scribe line between adjacent chips with an angle of 45 degrees relative to the scribe line as shown in FIG. 1 and also the illumination method of the present invention is taken which utilizes the aperture plate of FIG. 5 having two sector-shaped apertures, the field of view in the alignment microscope will not adversely be affected by the actual circuit patterns so that the position of the alignment mark can be detected with higher accuracy The fact that the alignment mark can be provided in the scribe line without any other pre-alignment region means that the yield can be improved.

If the wafer is moved to the exposure position W' while adjusting its amount of feed based on the resulting positional signals of such a mark, it will be fed, with higher accuracy, to the location in which the wafer will be finally aligned with the mask. The microscope system (shown by AS in FIG. 11) used after the wafer has been fed to the above location may be constructed in accordance with the present invention or may be of a different type since it is operated after the pre-alignment has been completed.

As shown in FIG. 12, the shape of aperture in the imaging system of the microscope according to the present invention may be rectangular or polygonal.

The shape of the aperture in the illumination system of the microscope can be determined in accordance with the shape of the aperture in the imaging system. More particularly, it is preferred that, if the aperture of the illumination system is observed in such a condition that it is imaged at the position of the aperture in the imaging system, the aperture in the illumination system is located in a region outside two sets of parallel lines perpendicular to each other which are obtained by using the rectangular aperture in the imaging system. This is shown in FIG. 8. In such an arrangement, the illumination system includes an aperture as shown in FIG. 5, the imaging system includes an aperture as shown in FIG. 12 and the alignment mark is the one as shown in FIG. 1.

The rectangular shape of the aperture in the imaging system provides the following advantages: First, the ability of detecting the pattern inclined relative to the orthogonal lines can be further increased in comparison with that of the circular aperture (shown by Co in FIG. 8). This is because the diffraction lights in the inclined pattern shown by x in FIG. 8 are blocked by the circular aperture but not by the rectangular aperture at the position P. The amount of diffraction lights obtained at the image plane I by using the rectangular aperture is the same as that of the circular aperture with respect to the orthogonal lines. However, with respect to the inclined pattern to be detected, the rectangular aperture provides the amount of diffraction lights increased by the amount of P at the image plane I. Therefore, the accuracy of detection for the pattern will be improved.

The second advantage is that the resolving power can be increased in the inclined pattern in addition to the increase of light amount if the same microscope system is used to change the dark field to the bright field.

The aperture in the illumination system may be modified in shape depending on the configuration of the pattern. For example, it may be preferred that the aperture plate of the illumination system includes four sector-shaped apertures located symmetrically to the optical axis along the respective diagonal lines as shown in FIG. 13. If a cross marks shown in FIG. 14 is used as an alignment mark together with the above aperture plate shown in FIG. 13, the ability of selecting the alignment mark on the wafer relative to the actual circuit pattern can be improved to increase the accuracy for alignment.

It is to be understood that the alignment will less be affected by the diffraction lights due to the orthogonal lines in the actual circuit pattern to increase the ability of alignment if the illumination system of the present invention for detecting only the diffraction lights distributing along the inclined line (of 45 degrees at optimum) is incorporated into the mask-wafer alignment microscope of the semiconductor exposure apparatus. Also, since the alignment mark can be located nearer the actual circuit pattern, the limitations with respect to the position of the alignment mark can remarkably be reduced, and therefore, the effective area on the mask can be increased.

Furthermore, the present invention can improve the ratio of S/N and increase the accuracy of signal detection if it is applied to the general microscope type length measuring mechanisms as well as to the pre-aligning mechanism of the semiconductor exposure apparatus.

Referring now to FIG. 15, there is shown an optical inspection apparatus according to an embodiment of the present invention. In FIG. 15, reference numeral 1 denotes a wafer on which a number of chips each providing a semiconductor circuit are formed. Of these chips, two chips are observed at one time through two microscopic systems, i.e. first and second microscopic systems. Each of the two microscopic systems has a view field which covers the entire area of one chip. The first microscopic system includes an objective lens 2a, a beam splitter 3a for introducing a light beam from an illumination system which will be described later, a relay lens 4a, an erector 5a, aperture means 6a such as an aperture plate for achieving a dark field detection, and a video image-pickup device 7a. The first microscopic system further includes an illumination system having an imaging lens 8a, aperture means 9a such as an aperture plate for achieving dark field illumination, a relay lens 10a, and a bundle of optical fibers 11a which functions as an illumination source. An unshown end of the fiber bundle 11a is opposed to an unshown white light source.

The second microscopic system is provided by similar components and includes an objective lens 2b, a beam splitter 3b, a relay lens 4b, an erector 5b, aperture means 6b and a video image-pickup device 7b. Similarly, the second microscopic system further includes an illumination system having an imaging lens 8b, aperture means 9b, a relay lens 10b and a bundle of optical fibers 11b. Also, an unshown end of the fiber bundle 11b is opposed to the same white light source for the first microscopic system or to a separate white light source.

The first and second microscopic systems are adapted to be displaced in parallel to the plane of the wafer 1, so that they are moved toward or away from each other in accordance with changes in the positions of the wafer chips or in the size of the chip. Further, the optical axes of the first and second microscopic systems can be aligned with each other by using unshown alignment marks formed on the wafer.

The optical inspection apparatus of the FIG. 15 embodiment further includes an electrical processing system having a synchronization circuit 20 for controlling synchronization of two read-out signals of the two image-pickup devices 7a and 7b, amplifiers 21a and 21b for amplifying, respectively, the signals from the image-pickup devices 7a and 7b, a comparator 22 for comparing the outputs of the amplifiers 21a and 21b with each other, and a limiter 23 for effecting binary-coding on the basis of the output from the comparator 22. An output signal of limiter 23 is introduced into a central processing unit (CPU) 24 in which presence of any fault is discriminated. The result of discrimination is displayed in a cathode ray tube 25 connected to the central processing unit 24.

In the FIG. 15 embodiment, the wafer 1 is illuminated in a dark-field manner through the objective lenses 2a and 2b. Details of such dark-field illumination will now be described with reference to FIG. 16. For the sake of best understanding of this aspect of the present invention, one of the two microscopic systems of the FIG. 15 apparatus is selected as a representative and is illustrated in FIG. 16, with the corresponding component being denoted by similar reference numerals but having no suffix such as a and b.

Figure 16:
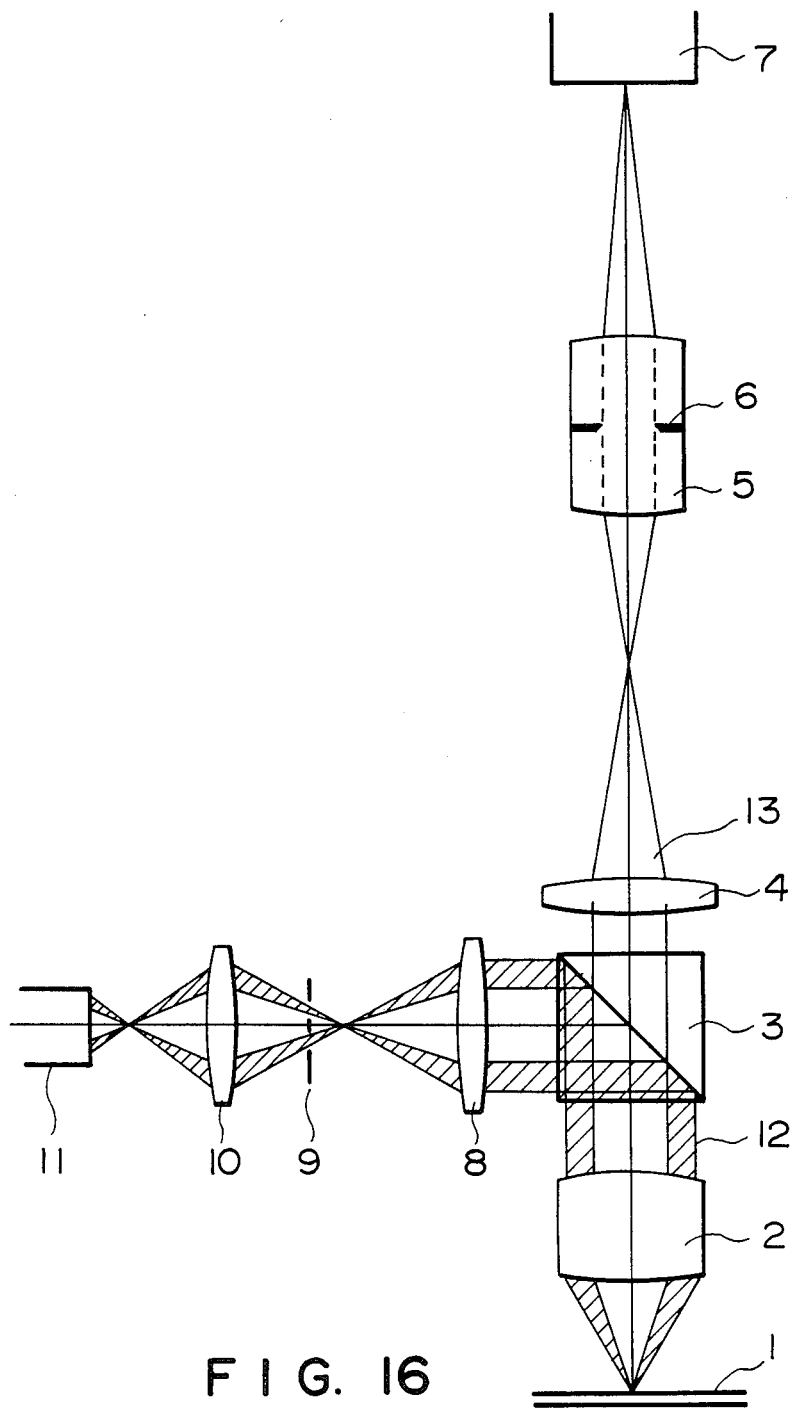
FIG. 16 is a sectional view schematically showing a major portion of the optical inspection apparatus shown in FIG. 15.

In FIG. 16, the hatched area shows an effective illumination light flux 12 to be directed to a point on the wafer 1, whereas the area as denoted by reference numeral 13 shows an effective light flux reflected from the same point on the wafer 1 surface and to be focused on the surface of the image-pickup device 7. The aperture means 6 is incorporated into the erector lens system 5 in order to restrict the diameter of the effective light flux 13 to be focused on the image-pickup device 7. On the other hand, the second aperture means 9 which is provided at the illumination system side is adapted to establish the effective illumination light 12 for achieving the dark field detection. Details of the aperture means 9 will be described later. The aperture means 6 is disposed in an optically conjugate relation with the aperture means 9 with respect to the wafer 1 surface. The aperture means 6 has a light-intercepting portion adapted to intercept the light rays specularly reflected from the wafer 1 surface and has formed therein an aperture which is shaped so as to transmit only the light rays scatteringly reflected from the wafer 1 surface.

The optical arrangement will now be described in more detail. The objective lens 2 and the relay lens 4 cooperate with each other in forming an image of the wafer 1 at a position between the relay lens 4 and the erector lens 5. The erector 5 is effective to reproduce such image on the image-pickup surface of the image-pickup device 7. The objective lens 2, the reflection surface of the beam splitter 3, the imaging lens 8 and the relay lens 10 cooperate with each other to define an illumination path. The aperture means 9 is located at a position optically conjugate with an unshown pupil of the objective lens 2 with respect to the imaging lens 8. The illumination source 11 is once imaged on the plane of the pupil of the objective lens 2, so that the wafer 1 surface is illuminated telecentrically. The aperture means 6 is disposed across the image-pickup path and is located at a position optically conjugate with the pupil of the objective lens 2.

Taking into account the aforementioned directional characteristic of the pattern of the integrated circuits or the like, examples of preferable shapes, including configuration and positions, of the apertures of the aperture means 9 at the illumination system side with respect to the pattern elements extending in particular directions are illustrated in FIGS. 17A–17F, with the hatched areas showing such apertures. Each of FIGS. 17A–17F shows a preferable aperture shape of the aperture means 9 (FIG. 16) when it is projected onto the aperture means 6. The region defined between two circles, an inner circle and an outer circle, is the light-intercepting area of the aperture means 6, while the region within the inner circle is the light-transmitting area of the aperture means 6. The hatched areas show the images of the light-transmitting apertures of the aperture means 9, as projected onto the aperture means 6. The phantom line shows the direction along which the particular pattern element to be detected elongates.

The elements of the circuit pattern, which are the subjects of inspection, are rectilinear elements extending vertically, horizontally and inclinedly with angles of ±45 degrees. In each of FIGS. 17A–17F, the region within the outer circle substantially corresponds to an area to which both the light beams specularly reflected by the wafer surface and passed through the objective lens 2 and the light beams scatteringly reflected by the wafer surface and passed through the objective lens 2 are directed, while the region within the inner circle corresponds to the flux of scatteringly reflected light beams which passes through the light-transmitting aperture of the aperture means 6. Although, in the present embodiment, the light-transmitting aperture of the aperture means 6 has a circular shape, it is not a requisition and other shapes are usable. The light-intercepting area formed by a ring-shaped portion defined between the inner and outer circles blocks the light beams specularly reflected by the wafer surface and directed to the aperture means 6. Details of the relationship between the direction of the pattern element and the shape of the aperture of the aperture means 9 will be described later.

Referring again to FIGS. 3 and 4, description will be made again to the distribution of the light beams which is caused by diffraction by a linear pattern element when it is illuminated in the dark field fashion and which depends on the direction of elongation of the pattern element, the distribution being observed in a plane containing the pupil of the microscopic system or in a plane optically conjugate with the pupil plane.

First, as described hereinbefore, a linear pattern element extending in a particular direction is disposed on an object plane (the plane of wafer 1 in FIG. 16). Next, a plate member having a pinhole formed therein is introduced at a position corresponding to that of the aperture means 9 (FIG. 16), with the pinhole thereof being coincident with the optical axis, such that the linear pattern element is illuminated with the light beam passed through the pinhole. By doing so, there occurs diffraction by linear pattern element and the diffracted light beams are distributed, on the surface of the aperture means 6 (FIG. 16) optically conjugate with the pupil plane, in a direction orthogonal to the direction of elongation of the linear pattern element. If, for example, the linear pattern element extends vertically such as shown in FIG. 3 at a reference character $l_v$, the diffraction light (scatteringly reflected light) caused by such linear pattern element is distributed horizontally and in opposite directions with respect to the zero-th order diffraction light (specularly reflected light). If, on the other hand, the linear pattern element is disposed horizontally such as shown in FIG. 4 at a reference character $l_h$, the diffraction light is distributed vertically. When the position of the pinhole of the plate member disposed at a position of the aperture means 9 (FIG. 16) is changed along a plane perpendicular to the optical axis, the diffraction light of the zero-th order as well as the diffraction light of the other orders, when observed in a plane containing the aperture means 6, are displaced accordingly in a direction perpendicular to the optical axis. This means that the distribution of diffraction light on the plane corresponding to the aperture means 6 is determined by the direction of elongation of the linear pattern element formed on the object and by the position of the pinhole of the plate member disposed at the location of the aperture means 9 (FIG. 16). Accordingly, if, in an inspection apparatus of the present embodiment, a suitable shape or position of the aperture of the aperture means 9 is selected relative to a particular pattern element extending in a particular direction, the specularly reflected light (the zero-th order diffraction light) from the wafer 1 can be blocked by the light-intercepting area of the aperture means 6, while only the diffractively scattered light from the pattern element can be passed through the light-transmitting area of the aperture means 6. By doing so, the dark field observation of the pattern element is accomplished.

Referring now to FIGS. 19–22, description will now be made to details of the determination of the aperture shape of the aperture means at the illumination system side, for achieving the dark field detection relative to a particular pattern element extending in a particular direction.

As described hereinbefore, the pattern of the integrated circuit or the like can be recognized as being an aggregation of rectilinear pattern elements extending vertically, horizontally and inclinedly with angles of +45 degrees and −45 degrees. In accordance with the present invention, the dark field detection relative to at least such portion of the different pattern elements extending in different directions, that extend in one direction, is first carried out and, thereafter, the remaining pattern elements extending in the other directions are subjected sequentially to similar dark field detection, whereby the inspection relative to the entire pattern is finally achieved. Thus, if in the present embodiment a particular pattern element extending in a particular direction is going to be subjected to the dark field detection, the pattern elements extending in the other directions are prevented from being detected.

It is now assumed that the dark field detection is going t be effected relative to a pattern element extending inclinedly with an angle of +45 degrees, i.e. extending in a direction from 37.5 minutes to 7.5 minutes as viewed in a clock. Therefore, the illumination light is applied to the object in such manner that the dark field detection is effected solely to the pattern element extending with the angle of +45 degrees, whereas any specularly reflected light and any diffractively scattered light from the pattern elements extending vertically, horizontally and inclinedly with an angle of −45 degrees are prevented from being detected. The conditions for the illumination light, which assure prevention of detection of the specularly reflected light and the diffractively scattered light from a pattern element extending in such a particular direction which is not desired to be detected, can be determined by drawing, in the plane of the aperture means at the detecting system side (aperture means 6 in FIG. 16), straight lines which intersect perpendicularly with the aforementioned unwanted particular direction and which contact tangentially with the effective diameter, in the plane of the aperture means on the detecting system side, of the light flux to be focused on the image-pickup means (7 in FIG.

16), which effective diameter corresponds to the diameter of aperture of the aperture means at the detecting system side. This will now be described in more detail with reference to FIG. 22.

FIG. 22 shows the pattern element inclined with the angle of +45 degrees, which is to be detected, when it is projected onto a plane containing the aperture means (6 in FIG. 16) at the detecting system side. In FIG. 22, reference character $O_1$ denotes the projected image of the pattern element to be detected, and a region $C_0$ defined by an inner circle shows an effective diameter of the light flux (scattered light) to be focused on the image-pickup device, the diameter corresponding to the aperture of the aperture means at the detecting system side. The region defined between the inner circle and an outer circle corresponds to the light-intercepting area of the aperture means 6 at the detecting system side. The unwanted pattern elements are in the directions of vertical, horizontal and −45 degrees, in the FIG. 10 case. However, for the sake of clarification of illustration, FIG. 22 has been drafted for the sake of description only with reference to the unwanted directions of vertical and horizontal. The straight lines perpendicularly intersecting with the unwanted directions, vertical and horizontal, and contacting tangentially with the effective light flux $C_0$ are denoted by reference characters N and M, respectively. One pair of the straight lines N are parallel to each other, and the other pair of the straight lines M are also parallel to each other.

The illumination light is supplied to the pattern element having an inclination +45 degrees in the manner that it causes two specularly reflected light fluxes directed respectively to such regions, in the plane containing the aperture means at the detecting system side, which are outside the region enclosed by the two pairs of parallel lines M and N and which are symmetrical with each other with respect to the direction of elongation of the projected image $O_1$ of the pattern element. That is, the illumination light is applied to the pattern element so as to cause two specularly reflected light fluxes directed respectively to the regions as denoted by $C'_1$ and $C'_2$ in FIG. 22. The diffraction phenomenon caused on the object plane by the illumination light whose specularly reflected light component would be incident on the region $C'_1$ will now be considered. Of the unwanted pattern elements extending in the particular directions which are not desired to be detected, the vertically extending pattern element causes, as has been described with reference to FIG. 3, diffraction light which is distributed horizontally and in opposite directions with respect to the zero-th order diffraction component, and the diffracted light beams are incident on the plane containing the aperture means at the detecting system side, such as shown by black small circles in FIG. 22, with the zero-th order diffraction component being incident on the region $C'_1$. On the other hand, the horizontally extending pattern element causes, as has been described with reference to FIG. 4, diffraction light which is distributed vertically and in opposite directions with respect to the zero-th order diffraction component, and the diffracted light beams are incident on the plane containing the aperture means at the detecting system side, such as shown by white small circles in FIG. 22, with the zero-th order diffraction component being incident on the same region $C'_1$. It is seen from FIG. 22 that every one of such diffracted light beams caused by the vertically extending pattern element and the horizontally extending pattern element is intercepted by the light-intercepting area of the aperture means at the detecting system side so that none is mixed into the effective flux $C_0$ which is to be focused on the image-pickup means (7 in FIG. 2). To be exact, the diffraction components shown in FIG. 22 by the black and white small circles located outside the light-intercepting area of the aperture means has been eclipsed or shaded by the lens systems 2, 4, 5, etc. (FIG. 16).

As compared therewith, the pattern element having an inclination of +45 degrees, which is to be detected, causes diffraction light which is distributed along a direction orthogonal to the projected image $O_1$ of the pattern element and in opposite directions with respect to the zero-th order diffraction component, in compliance with the principle of diffraction as has been described with reference to FIGS. 3 and 4, and the diffracted light beams are incident on the plane of the aperture means of the detecting system side, such as shown by cross marks in FIG. 22, with the zero-th order diffraction component being similarly incident on the region $C'_1$. And, a portion of such diffracted light beams, except for the zero-th order component, passes through the light-transmitting area of the aperture means.

The above-described diffraction phenomenon with respect to the illumination light whose specularly reflected component is directed to the region $C'_1$ substantially applies to the illumination light whose specularly reflected component would be incident on the other region $C'_2$. That is, only a portion of the diffracted light beams, except for the zero-th order component, caused by the pattern element having the inclination of +45 degrees, which is to be detected, is allowed to pass through the light-transmitting area of the aperture means, as a part of the effective flux $C_0$. By this, only the pattern element extending in the direction of +45 degrees can be detected in the dark field.

In order to obtain a higher intensity of the diffractively scattered light to be focused on the image-pickup means (7 in FIG. 16), it is preferable to pickup diffraction components of lower-orders, as the effective light flux $C_0$. Only from such viewpoint, it may occur to one that the illumination light is supplied to the pattern element extending in the direction of ±45 degrees in the manner that the specularly reflected components from the object are directed respectively to such regions which are within a region enclosed by the two pairs of parallel lines M and N and which are outside the effective flux diameter $C_0$. In such case, however, the diffractively scattered light beam caused by the pattern elements extending vertically and horizontally would be mixed into the effective light flux $C_0$ and, as the result of which, the detection of only the pattern element having the inclination of ±45 degrees is no more possible. In view of this, the illumination light is supplied to the pattern element having the inclination of +45 degrees in the manner that it causes specularly reflected light components directed respectively to the regions $C'_1$ and $C'_2$ each of which extends outwardly from the intersection of two straight lines M and N contacting tangentially with the effective light flux $C_0$, the intersection being the limit of prevention of introduction of the diffractively scattered light caused by the unwanted pattern elements.

A preferable aperture shape of the aperture means (9 in FIG. 16) at the illumination system side, assuring the illumination light whose specularly reflected components would be directed respectively to the regions $C'_1$ and $C'_2$ is illustrated in FIG. 19. As has already been described with reference to FIG. 16, the aperture means 9 at the illumination system side and the aperture means 6 at the detecting system side are optically conjugate with each other. This means that, when an aperture plate such as at 9' shown in FIG. 19 is employed as the aperture means at the illumination system side while an aperture plate such as at 6' shown in FIG. 20 is employed as the aperture means at the detecting system side (each hatched-area showing the light-intercepting area), the images of the light-transmitting apertures $C_1$ and $C_2$ of the aperture means at the illumination system side are formed on the aperture means at the detecting system side. FIG. 21 shows this. In FIG. 21, the areas $C'_1$ and $C'_2$ shown by broken lines designate the images of the apertures $C_1$ and $C_2$ respectively and, therefore, the specularly reflected light components are incident on these regions, respectively. Clearly, this corresponds to the situation of FIG. 22. From the above, it is seen that use of the aperture shape shown in FIG. 19 does provide the specularly reflected light components just directed respectively to the regions $C'_1$ and $C'_2$ of FIG. 22.

Figure 17A:
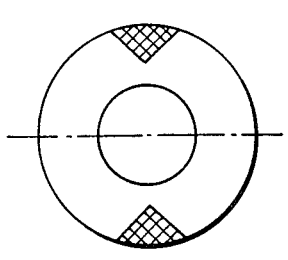
FIGS. 17A-17F are plan views, respectively, showing aperture shapes of aperture means at an illumination system side, for achieving dark field illumination with predetermined directionarities relative to linear pattern elements extending in particular directions, the apertures being illustrated as projected onto a dark field detection filter having a circular light-transmitting area.
Figure 17B:
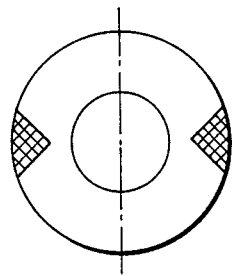
Figure 17C:
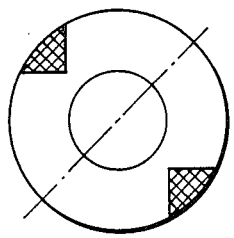
Figure 17D:
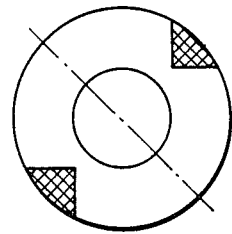
Figure 17E:
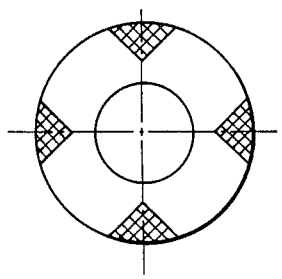
Figure 17F:
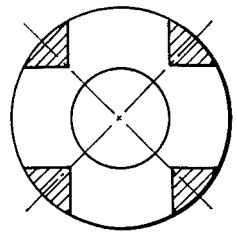

Referring back to FIGS. 17A–17F, the aperture means 9 at the illumination system side is provided with apertures of suitable shapes with respect to different pattern elements extending in different directions, in accordance with the principle as has been described in the foregoing. More specifically, the aperture shape shown in FIG. 17A is one suitable for detecting only a pattern element extending horizontally and effective to prevent detection of pattern elements extending vertically and inclinedly with angles of ±45 degrees. As described hereinbefore, the hatched areas show the images of the apertures of the aperture means 9 as projected on the aperture means 6 in FIG. 16. The phantom line shows the direction of elongation of the pattern element to be detected. Similarly, the aperture shape illustrated in FIG. 17B is one suitable for detecting only a pattern element extending vertically. On the other hand, the aperture shape shown in FIG. 17C is one suitable for detecting a pattern element extending inclinedly with an angle of +45 degrees, as in the case of FIG. 22, while the aperture shape shown in FIG. 17D is one suitable for detecting only a pattern element extending inclinedly but with an angle of −45 degrees. As compared therewith, the aperture shape shown in FIG. 17E is one suitable for detecting a vertically extending pattern element as well as a horizontally extending pattern element but effective to prevent detection of inclined pattern elements. On the other hand, the aperture shape shown in FIG. 17F is one suitable for detecting only the inclined lines but effective to prevent detection of vertically extending pattern elements and horizontally extending pattern elements. While, in FIGS. 17A–17F, each of the apertures is illustrated as having a configuration of fan-shape, this is only an example and other configurations are usable.

In the embodiment shown in FIGS. 15 and 16, the aperture shapes of FIGS. 17A–17D or FIGS. 17E and 17F are interchangeably used to achieve detection of any fault of the pattern, in accordance with each of the directional characteristics of the pattern elements. For example, the apertures of the aperture means 9 shown in FIGS. 17A–17D are interchangeably placed at the position of the aperture means 9, as shown in FIG. 16, in the sequence of the FIG. 17A structure, the FIG. 17B structure, the FIG. 17C structure and the FIG. 17D structure. By doing so, each of the horizontally extending pattern element, the vertically extending pattern element, the inclined pattern element with an angle of +45 degrees and the inclined pattern element with an angle of −45 degrees can be inspected sequentially in the named order and independently from the others. On the other hand, where the apertures shown in FIGS. 17E and 17F are interchangeably used at the position of the aperture means 9 in FIG. 16, in the sequence of the FIG. 17E structure and the FIG. 17F structure, the inspecting operation is simply effected through two steps, i.e. the first step for detecting any fault in the vertically extending pattern element and the horizontally extending pattern element and the second step for detecting any fault in the pattern elements inclined with the angles of ±45 degrees.

The interchanging of the apertures for the aperture means 9 can be easily achieved by, for example, intermittently rotating a rotary disc having formed therein corresponding apertures, such as shown in FIG. 18. As an alternative, a hollow-shaft motor may be used with a disc member having formed therein apertures such as shown in FIGS. 17A or 17E. In such case, the disc member is fitted into the hollow shaft of the motor, and the motor is actuated intermittently. It is a possible alternative to use an image rotator which is introduced into the inspection optical system to rotate the light beam.

In the embodiment shown in FIG. 15, two output signals produced by two image-pickup devices 7a and 7b and corresponding to two chips on the wafer 1 is compared with each other. More specifically, the two chips on the wafer 1 are illuminated in exactly the same manner, according to the illumination process as has been described with reference to FIG. 16. The synchronization circuit 20 shown in FIG. 15 controls the readout so that two mutually corresponding portions of the two chips are read-out, simultaneously, by the image-pickup devices 7a and 7b. The output signals of the image-pickup devices 7a and 7b are compared with each other. If there is no difference between these output signals, it is discriminated that neither a fault nor a foreign particle exists. If, on the other hand, there is a difference between the output signals, presence of any fault or foreign particle is discriminated. When, for example, the inspection relative to the pattern elements extending horizontally is competed, the apertures of the aperture means 9 are interchanged in a sequential manner as described in the foregoing, to thereby effect the inspection sequentially relative to the pattern elements extending in the other directions. After the complete inspection relative to the two chips is finished, another pair of chips are then subjected to the inspection and similar operations are carried out. By repeating such inspection, each of faulty chips, if any, can be finally specified.

In the FIG. 15 embodiment, as described above, two series of output signals of the image-pickup devices concerning two chips are compared with each other. However, each of the two series of output signals may be compared with a reference, a series of signals, preparatively stored in a memory. As a further alternative, one of the two microscopic systems of the FIG. 15 embodiment may be omitted so that only one chip is inspected at one time. In such case, the series of output signals of the sole image-pickup device is compared with a reference signal series preparatively stored in a memory.

Besides the dark field detecting optical system as has been described in the foregoing, the present invention is easily applicable to a known type dark field optical system. FIG. 23A shows an example of this, wherein the invention is applied to a dark field system known as a ring-mirror illumination system. Elements of the FIG. 23A embodiment having corresponding functions as of those in the preceding embodiment are denoted by the same reference numerals. As shown in FIG. 23A, a ring-mirror 31 reflects light beams, for illuminating a wafer 1, toward a ring-shaped lens 32 so that the light beams reflected by the ring-mirror 31 travel through the space outside a barrel of an objective lens 2, then pass through the ring-shaped lens 32 and finally are incident on the wafer 1 to illuminate the same. Aperture means 9 having the same function as that of the aperture means 9 shown in FIG. 16 is inserted into the illumination system at a position between an unshown light source and the ring-mirror 31. Thus, with the change or interchange of the aperture shapes (see FIG. 18), the direction of incidence of the illumination light is changed so that the subject of detection is changed accordingly.

FIG. 23B is a schematic view showing a two-dimensional angular distribution of the light beams which are sequentially incident on one point on the wafer 1 surface and of the light beams reflected sequentially from that point on the wafer, the distribution being observed on a plane A in FIG. 23A. FIG. 24 shows such distributed light beams in a schematic and perspective view. In FIG. 23B, each of hatched areas shows the range of angular distribution which is preferably to be established in the illumination light relative to a particular pattern element extending in a particular direction. More specifically, the hatched areas 33a and 33e correspond to the illuminating light beams to be supplied to a pattern element extending horizontally, while the hatched areas 33b and 33f correspond to the illuminating light beams to be supplied to a pattern element having an inclination of an angle of +45 degrees. In this manner, a predetermined angular distribution is selected in accordance with the direction of elongation of the pattern element which is going to be detected. Since substantially the same explanation as has been made with reference to FIGS. 17A-17F applies to FIG. 23B, further description will be omitted here merely for the sake of simplification.

In summary, with the interchanging of the aperture shapes (see FIG. 18), appropriate directions of incidence of the illumination light are selected sequentially in accordance with the directions of the pattern elements. It is to be noted that, in the FIG. 23A embodiment, additional aperture means such as the aperture means 6 at the detecting system side in the embodiment shown in FIGS. 1 and 2 is not necessary. This is because, in the arrangement of the present embodiment, the specularly reflected light component which goes through the region B shown in FIG. 12 is eclipsed or shaded by the objective lens 2.

Figure 25A:
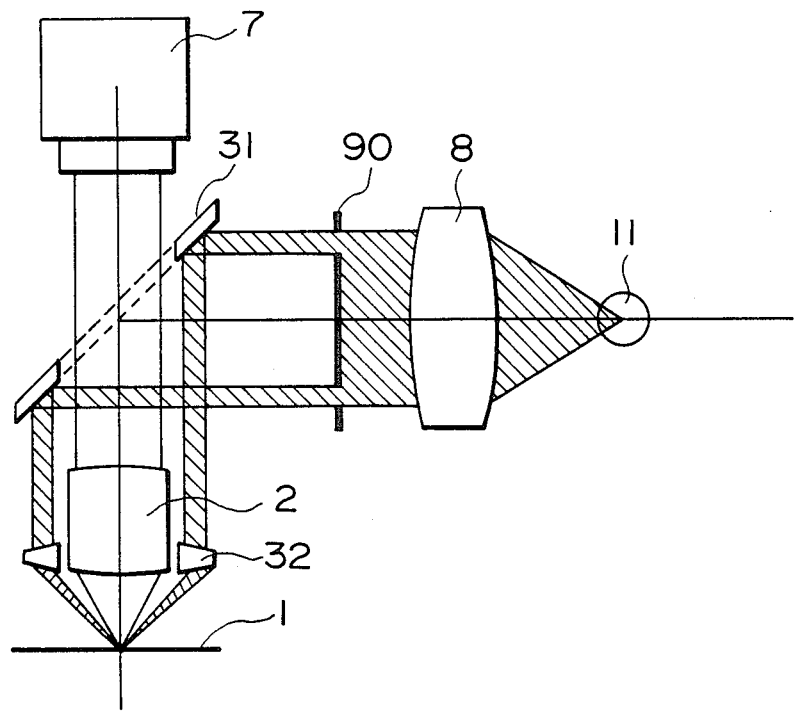
FIG. 25A is a sectional view schematically showing an optical inspection apparatus according to a further embodiment of the present invention, which is a modification of the FIG. 23 embodiment.
Figure 25B:
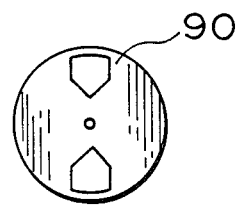
FIG. 25B is a plan view showing aperture means at an illumination system side, used in the apparatus of FIG. 25A.

A modification of the FIG. 23A embodiment is shown in FIGS. 25A and 25B. In this modification, aperture means 90 such as an aperture plate shown in FIG. 25B is used in substitution for the aperture means 9 such as shown in FIG. 18. The aperture means 90 has formed therein two apertures, only, which are located symmetrically with respect to the optical axis. The aperture means 90 is disposed at a position corresponding to that of the aperture means 9 and is made rotatable about the optical axis. Thus, by changing sequentially the rotational position of the aperture means 90, images of different pattern elements extending in different directions are sequentially formed, in the dark field, on the image-pickup surface of the image pickup device 7. Since the remaining portion of the FIG. 25A embodiment is essentially the same as that of the FIG. 23A embodiment, further description to the FIG. 25A embodiment will be omitted by assigning the same reference numerals to the elements having corresponding functions as of those of the FIG. 23A embodiment.

Figure 26A:
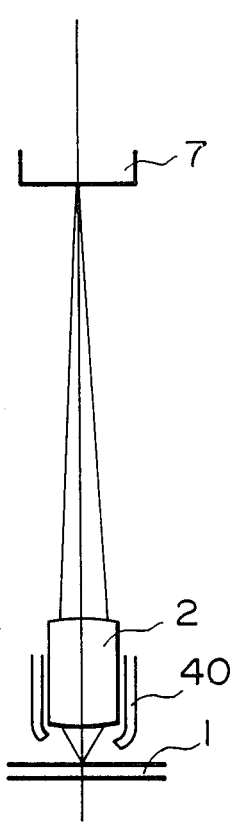
FIG. 26A is a schematic view showing a dark field illumination system in an optical inspection apparatus according to a still further embodiment of the present invention.
Figure 26B:
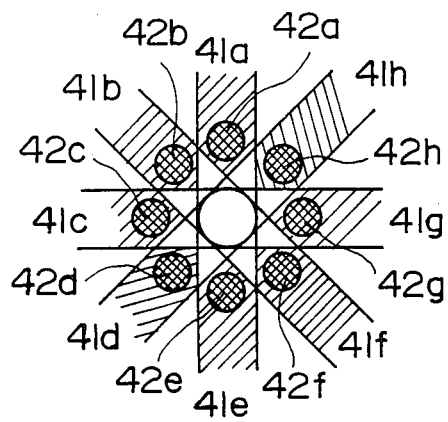
FIGS. 26B and 26C are schematic views, respectively, showing examples of end portion arrangements of bundles of optical fibers usable in the apparatus of FIG. 26A.
Figure 26C:
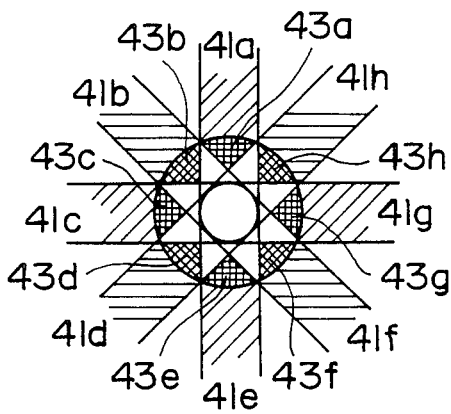

An optical inspection apparatus according to a further embodiment of the present invention is illustrated schematically in FIG. 26A. In this embodiment, a combination of bundles of optical fibers is used. No aperture means such as the aperture means 9 in the foregoing embodiments is employed and, in substitution therefor, the bundles of the fibers are selectively used to effect illumination. This attains substantially the same effects which are provided by interchanging the aperture shapes formed in the aperture means 9 in the foregoing embodiments. Details of this will be described with reference to FIGS. 26B and 26C. FIG. 26B shows an example of the positional relation of the end portions of the bundles, in a case where each bundle has a circular cross-section. FIG. 26C shows another example of the positional relation of the end portions of the bundles, in a case where each bundle has a fan-shaped cross-section.

Figure 27:
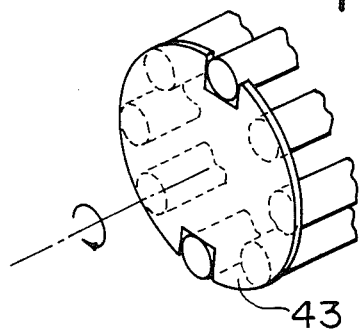
FIG. 27 is a perspective view schematically showing an example of irradiation selection means usable in the apparatus of FIG. 26A.

For example, in order to detect a pattern element extending horizontally, it is necessary to dispose the light-emitting ends of two fiber bundles within the regions as denoted by hatched areas 41a and 41e shown in FIG. 26B or 26C. In this manner, the light-emitting end faces of the bundles of optical fibers are disposed so as to establish a positional relation as denoted by double-hatched circles 42a-42h in the case where each bundle has a circular cross-section, while they are disposed to establish a positional relation as shown in FIG. 26C by double-hatched areas 43a-43h in the case where each bundle has a fan-shaped cross-section. The selection of appropriate ones of the bundles of fibers can be achieved by, for example, intermittently rotating a light-blocking disc 43, such as shown in FIG. 27, which is provided with light-transmitting notches and which is rotatably disposed at a position opposed to the light-receiving end faces of the fiber bundles.

In some of the foregoing embodiments, one aspect of the invention has been described with reference to the inspection of the pattern formed on the wafer which is a reflective object. However, the invention in this aspect is not limited thereto but applicable also to the inspection of the pattern formed on a photomask or reticle. In such case, the inspection of the pattern can be achieved not only by the use of reflection of the illumination light but also by the use of transmission of the illumination light. In the event that the transmission is utilized, it is no more necessary to use a single objective lens system both for the purpose of illumination and for the purpose of imaging, as in the case of FIG. 16. This is advantageous in the point of prevention of flare. Moreover, the arrangement of the optical system can be simplified. This will be easily understood from the fact that, when the inspection apparatus is arranged to provide the illumination light which travels outside the objective lens such as in the case of FIG. 23A embodiment or FIG. 25A embodiment, the optical arrangement can be simple as compared with that of the FIG. 16 embodiment.

Further modifications are also possible within the scope of the present invention. For example, the aperture means 9 such as shown in FIG. 16 can be replaced by bundles of optical fibers having end faces disposed at the position of the aperture means 9. Appropriate ones of such bundles of fibers are selected as the light-transmitting members, in accordance with the direction of elongation of the pattern element which is desired to be detected. By changing the selection, images of different pattern elements extending in different directions can be sequentially formed, in the dark field, on the image-pickup surface of the image-pickup device.

While the invention has been described with reference to the structures disclosed herein, it is not confined to the details set forth and this application is intended to cover such modifications or changes as may come within the purposes of the improvements or the scope of the following claims.

What is claimed is:

1. An optical apparatus for detecting an image without patterns in predetermined orthogonal directions, comprising:

optical illumination means for illuminating an object by projecting a light beam along an optical axis of said optical illumination means, said optical illumination means including a first aperture member having a light blocking portion and a light transmitting portion, with said light blocking portion located on the optical axis of said optical illumination means;

optical imaging means for projecting an image of the object along an optical axis of said optical imaging means, said optical imaging means including a second aperture member having a light transmitting portion and a light blocking portion, said light transmitting portion of said second aperture member being located on the optical axis of said optical imaging means, said second aperture member being located at a position optically conjugate with said first aperture member; and means for detecting an image formed by said optical imaging means, wherein said light blocking and light transmitting portions of each of said first and second aperture members are configured so that when an image of said first aperture member is projected on said second aperture member, said light transmitting portion of said first aperture member is imaged on said light blocking portion of said second aperture member, and at such a position which is not interposed between either of two sets of parallel lines tangential to the light transmitting portion of said second aperture and extending in the directions corresponding to the orthogonal directions.

2. An apparatus according to claim 1, further comprising a third aperture member interchangeable with said first aperture member, said third aperture member including a light transmitting portion located on the optical axis of said optical illumination means when said third aperture member is interchanged with said first aperture member.

3. An optical apparatus for detecting an image without patterns in predetermined orthogonal directions, said apparatus comprising:

optical illumination means having an optical axis and an objective optical system, for illuminating an object by projecting a light through said objective optical system;

optical imaging means having an optical axis and including, as a part thereof, said objective optical system, for projecting an image of the object through said objective optical system;

a beam splitter disposed at a side of said objective optical system remote from the object, said beam splitter being effective to separate the optical axes of said optical illumination means and said optical imaging means from each other;

a first aperture member having a light blocking portion and a light transmitting portion, with said light blocking portion being located on such portion of the optical axis of said optical illumination means that is separated by said beam splitter;

a second aperture member having a light transmitting portion and a light blocking portion, with said light transmitting portion of said second aperture member being located on such portion of the optical axis of said optical imaging means that is separated by said beam splitter; and means for detecting an image formed by said optical imaging means;

wherein substantially all the rays of light passed through said light transmitting portion of said first aperture member and specularly reflected by the object are intercepted by said second aperture member and at positions which are not interposed between either of two sets of parallel lines tangential to said light transmitting portion of said second aperture member and extending in the directions corresponding to the orthogonal directions.

4. An optical apparatus for observing a pattern defined by a plurality of linear pattern elements extending in different directions, comprising:

means for irradiating the pattern with a light beam;

means for receiving the light beam from the pattern to observe the pattern; and means effective for sequentially forming, on said observing means, a dark field image of a pattern element of the pattern extending in a direction and a dark field image of another pattern element extending in another direction, said dark field image forming means including first and second aperture stop members which are disposed in an optically conjugate relation with each other and which are cooperable with each other in the formation of the dark field image, said dark field image forming means being disposed in a path of the light beam from said irradiating means and the pattern and/or in a path of the light beam from the pattern to said observing means.

5. An inspection apparatus for inspecting an object having patterns extending in predetermined orthogonal directions, said apparatus comprising:

an optical illumination arrangement for illuminating the object, said optical illumination arrangement including first aperture means having a light blocking portion and a light transmitting portion, with said light blocking portion located on an optical axis of said optical illumination arrangement;

an optical imaging arrangement for forming an image of the object illuminated by said optical illumination arrangement, said optical imaging arrangement including second aperture means placed in an optically conjugate relation with said first aperture means and having a light blocking portion and a light transmitting portion, with said light transmitting portion of said second aperture means located on an optical axis of said optical imaging arrangement;

wherein said first and second aperture means are disposed so that an image of said light transmitting portion of said first aperture means is projected upon said light blocking portion of said second aperture means and at such a position which is not interposed between either of two sets of parallel lines tangential to said light transmitting portion of said second aperture means and extending in the directions corresponding to the orthogonal directions; and detecting means for detecting the image of the object formed by said optical imaging arrangement, so that on the basis of the detection by said detecting means any defect of the object is detected.

* * * * *

UNITED STATES PATENT AND TRADEMARK OFFICE
CERTIFICATE OF CORRECTION

PATENT NO. : 4,871,257

DATED : October 3, 1989

INVENTOR(S) : AKIYOSHI SUZUKI, ET AL.

It is certified that error appears in the above-identified patent and that said Letters Patent is hereby corrected as shown below:

On the title page:
IN [63] RELATED U.S. APPLICATION DATA

"Ser. No. 773,771, May 14, 1985" should read
--Ser. No. 733,771, May 14, 1985--.

COLUMN 1

Line 31, "articles" should read --articles.--.
Line 56, "accuracy" should read --accuracy.--.
Line 65, "operator" should read --operator.--.

COLUMN 6

Line 4, "be" should be deleted.

COLUMN 7

Line 22, "distance" should read --distance.--.
Line 49, "it the" should read --its--.
Line 68, "covers" should read --cover--.

COLUMN 8

Line 13, "accuracy" should read --accuracy.--.

COLUMN 12

Line 46, "t" should read --to--.

UNITED STATES PATENT AND TRADEMARK OFFICE
CERTIFICATE OF CORRECTION

PATENT NO. : 4,871,257

DATED : October 3, 1989

INVENTOR(S) : AKIYOSHI SUZUKI, ET AL.

It is certified that error appears in the above-identified patent and that said Letters Patent is hereby corrected as shown below:

COLUMN 16

Line 49, "competed," should read --completed,--.

Signed and Sealed this

Twenty-fifth Day of August, 1992

*Attest:*

DOUGLAS B. COMER

*Attesting Officer*     *Acting Commissioner of Patents and Trademarks*